Oct. 20, 1970 P. H. WOOD 3,535,486

ELECTRICAL PRINTED CIRCUIT ASSEMBLIES

Filed July 16, 1968

INVENTOR
Peter Henry Wood
BY Glascock, Downing & Seebold
ATTORNEYS 3,535,486

ELECTRICAL PRINTED CIRCUIT ASSEMBLIES

Peter Henry Wood, Birmingham, England, assignor to Joseph Lucas (Industries) Limited, Birmingham, England Filed July 16, 1968, Ser. No. 745,176
Int. Cl. B23k *1/04;* H05k *1/18*
U.S. Cl. 219—85 3 Claims

ABSTRACT OF THE DISCLOSURE

A method of manufacturing an electrical printed circuit assembly including a tile, a frame and a cover comprises providing a respective layer of a material which will adhere to the parts to the surface to be joined and fusing these together with the use of a brazing compound and passing an electrical current through an electrical resistor printed on one of the parts, the resistor being disposed adjacent to the region at which the junction is to be made.

This invention relates to a method of manufacturing electrical printed circuit assemblies of the kind in which there is a ceramic tile on which is printed at least part of an electrical circuit, and on which is mounted at least one slide, on which further printed circuits and passive electrical or electronic components are printed. Such assemblies will be referred to for convenience as being of the kind specified.

In such assemblies the slide is normally made of glass and is encapsulated to prevent deterioration, in an inert atmosphere. Such encapsulating of the slide is accomplished by securing to the tile a ceramic frame which surrounds the slide, and securing a ceramic lid upon the frame. Among other methods of securing the parts of the assembly together, it has been proposed to print onto the interengaging faces of the parts to be joined, material which will adhere to the ceramic, and to which a bonding material, such as solder, will adhere. Soldering or brazing is then performed by applying heat from an external source. This method has not however been found to be wholly satisfactory, as it is difficult to ensure even and consistent heat transfer to the ceramic lid. It is further important that heating of the parts is minimised in order to minimise the risk of damage to the glass slide.

An object of the invention is to provide an improved method for treating the ceramic parts in an even and consistent manner.

In accordance with the present invention a method of manufacturing an electrical printed circuit assembly of the kind specified comprises printing onto the interengaging surfaces of two parts of the assembly to be joined respectively, layers of a material which will adhere thereto, printing onto at least one of the parts an electrical resistor adjacent to the interengaging surfaces of the parts, placing the two parts together with a brazing compound between the layers of printed material, and passing a current through said resistor to heat the parts in the region at which they are to be joined to cause melting of the brazing compound between the printed layers on the interengaging surfaces of the parts.

The invention also resides in an electrical printed circuit assembly whenever manufactured by the method specified in the preceding paragraph.

Figure 2:
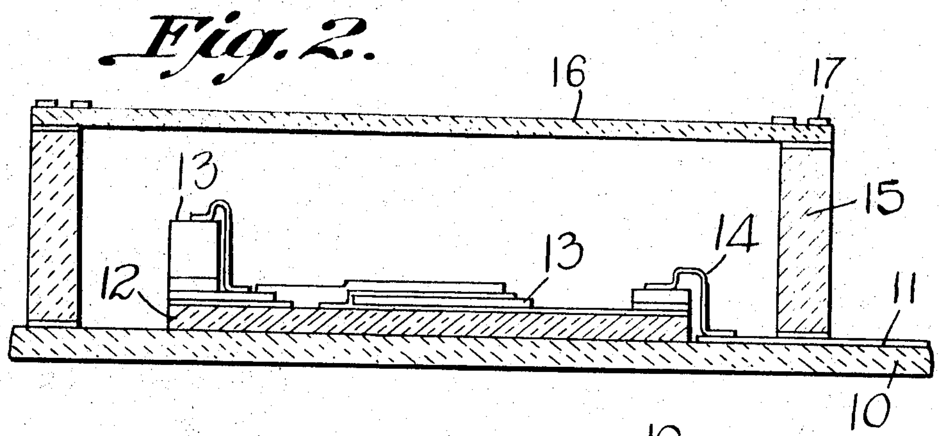
Figure 1:
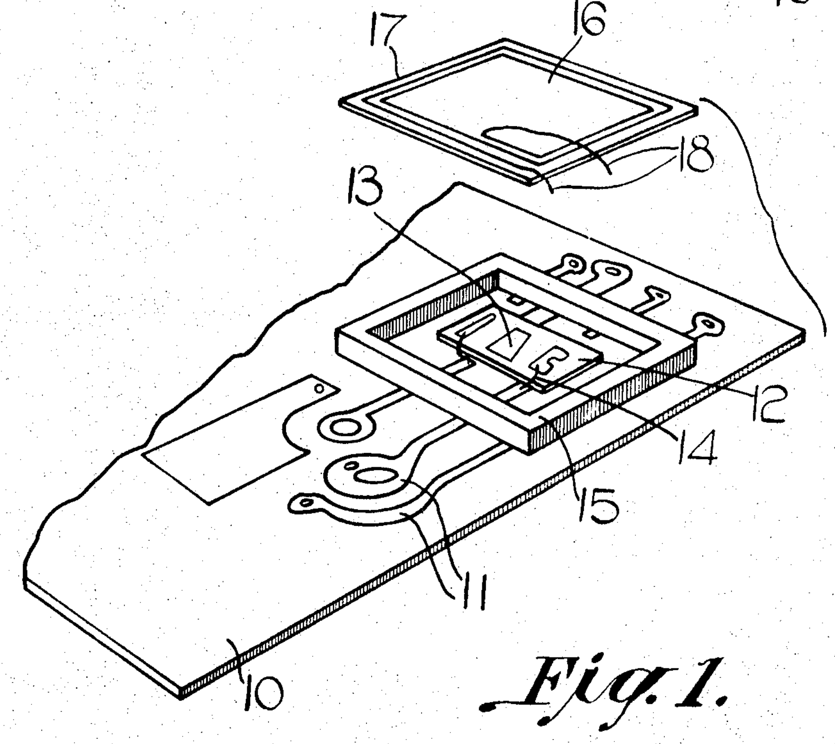

The invention will now be described by way of example with reference to the accompanying drawing, the FIG. 1 of which is an exploded view of a printed circuit assembly constructed in accordance with this invention and FIG. 2 is a cross-sectional view.

In the drawing, there is illustrated a ceramic tile 10 on at least one side of which is printed an electrical circuit or part thereof, indicated generally at 11, and in this example the material used for printing is a copper/gold alloy.

Secured to the tile 10 is a glass slide 12 on which further printed circuits or parts thereof are formed, and additionally there are provided on the glass slide 12 active components such as capacitors and resistors indicated at 13. Connections between the circuits on the tile 10 and on the slide 12 are achieved by gold wires 14 which are connected to the circuits respectively.

The glass slide 12 requires encapsulation within an enclosure having an inert atmosphere to prevent deterioration, and such encapsulation is achieved by securing to the tile 10 a frame 15 which surrounds the glass slide 12. This frame 15 is also formed from a ceramic material similar to that used for the tile 10, and is secured in place by means of a glass bond.

Secured to the frame 15 is ceramic lid 16, which unlike the frame 15 must be secured in place after the glass slide 12 has been secured to the tile 10 and after the connection 14 has been completed, and in order that an adequate seal is formed around the interengaging surfaces of the frame and of the lid 16, these interengaging surfaces are printed respectively with layers of a material which will adhere adequately to the ceramic from which these parts are made, and which can be brazed to one another by a brazing compound applied between them. Conveniently this material is the copper/gold alloy which is used for the printed circuit 11 upon the tile 10. Moreover, the brazing compound may be a tin based solder, gold/tin, or gold/germanium alloy.

In order to form the brazed seal between the frame 15 and the lid 16, the interengaging surfaces must be heated to cause fusion between the brazing compound and the surface layers thereon. For this purpose the lid 16 is printed on its opposite surface with an electrical resistor 17 having a configuration corresponding to the interengaging surfaces of the frame 15 and lid 16. The resistor 17 has external connections 18 to electrical apparatus, whereby a current can be passed through the resistor 17, so that local heating takes place to effect the seal. It will be observed that the lid 16 is formed from a thin panel of the ceramic, and in order that there shall not be too great heat differential between the outer edges of the lid at which the resistor 17 is provided, and the mid-region of the lid, it may also be necessary to provide for portions of the resistor 17 to extend across the mid-region of the lid.

The electrical resistor 17 is conveniently printed in a material having a higher electrical resistance than the copper/gold alloy employed for the interengaging surfaces of the parts to be joined, and conveniently this material is a copper/manganese alloy.

Having thus described my invention what I claim as new and desire to secure by Letters Patent is:

1. A method of manufacturing a component on an electrical printed circuit assembly comprising printing onto the interengaging surfaces of two parts of the component to be joined respectively, layers of a material which will adhere thereto, printing onto at least one of the parts an electrical resistor adjacent to the interengaging surfaces of the parts, placing the two parts together with a brazing compound between the layers of printed material, and passing a current through said resistor to heat the parts in the region at which they are to be joined to cause melting of the brazing compound between the printed layers on the interengaging surfaces of the parts.

2. A method as claimed in claim 1 in which the material applied to the surfaces is a copper/gold alloy.

3. A method as claimed in claim 1 in which the brazing compound is selected from the group consisting of tin, gold/tin and gold/germanium alloy.

References Cited

UNITED STATES PATENTS

| | | |
|---|---|---|
| 2,465,722 | 3/1949 | Hamilton. |
| 3,312,540 | 4/1967 | Plumbo et al. |
| 3,381,372 | 5/1968 | Capano. |
| 3,404,215 | 10/1968 | Burks et al. |

DARRELL L. CLAY, Primary Examiner

U.S. Cl. X.R.

29—627; 174—52; 317—101